(12) United States Patent
Li et al.

(10) Patent No.: US 12,119,541 B2
(45) Date of Patent: Oct. 15, 2024

(54) PACKAGE STRUCTURE AND ANTENNA DEVICE USING THE SAME

(71) Applicant: InnoLux Corporation, Miao-Li County (TW)

(72) Inventors: I-Yin Li, Miao-Li County (TW); Tang-Chin Hung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 92 days.

(21) Appl. No.: 17/848,508

(22) Filed: Jun. 24, 2022

(65) Prior Publication Data
US 2022/0320713 A1 Oct. 6, 2022

Related U.S. Application Data

(63) Continuation of application No. 16/246,663, filed on Jan. 14, 2019, now abandoned.
(Continued)

(51) Int. Cl.
*H01Q 1/22* (2006.01)
*H01L 23/498* (2006.01)
(Continued)

(52) U.S. Cl.
CPC ..... *H01Q 1/2283* (2013.01); *H01L 23/49838* (2013.01); *H01L 23/552* (2013.01);
(Continued)

(58) Field of Classification Search
CPC .......... H01Q 1/2283; H01Q 1/38; H01Q 1/50; H01L 23/49838; H01L 23/552;
(Continued)

(56) References Cited

U.S. PATENT DOCUMENTS 10,903,560 B2 * 1/2021 Loeher ...................... H01Q 1/38
11,222,852 B2 * 1/2022 Chiu ..................... H01L 21/486
(Continued)

FOREIGN PATENT DOCUMENTS

CN 107068659 A 8/2017

OTHER PUBLICATIONS

Chinese language office action dated Jul. 10, 2023, issued in application No. CN 202110788089.2.
(Continued)

*Primary Examiner* — Seung H Lee
(74) *Attorney, Agent, or Firm* — McClure, Qualey & Rodack, LLP

(57) ABSTRACT

An antenna device is provided. The antenna device includes a first substrate and a second substrate facing the first substrate. The first substrate includes an inner surface and an outer surface opposite the inner surface of the first substrate. The second substrate includes an inner surface and an outer surface opposite the inner surface of the second substrate. The antenna device also includes a die disposed between the first substrate and the second substrate, a redistribution layer disposed between the die and the inner surface of the second substrate, and an antenna unit electrically connected to the die via the redistribution layer. The antenna unit is arranged on at least one of the inner surface of the first substrate, the outer surface of the first substrate, the inner surface of the second substrate, and the outer surface of the second substrate.

13 Claims, 4 Drawing Sheets

Related U.S. Application Data

(60) Provisional application No. 62/711,671, filed on Jul. 30, 2018.

(51) Int. Cl.
*H01L 23/552* (2006.01)
*H01L 23/66* (2006.01)

(52) U.S. Cl.
CPC ...... *H01L 23/66* (2013.01); *H01L 2223/6616* (2013.01); *H01L 2223/6677* (2013.01)

(58) Field of Classification Search
CPC ............. H01L 23/66; H01L 2223/6616; H01L 2223/6677; H01L 2224/16225; H01L 23/20; H01L 23/3121; H01L 23/3135; H01L 23/053; H01L 23/49833
See application file for complete search history.

(56) References Cited

U.S. PATENT DOCUMENTS

| | | |
|---|---|---|
| 2013/0207262 A1 | 8/2013 | Lachner |
| 2019/0116670 A1* | 4/2019 | Anderson ............ H01Q 1/2283 |
| 2019/0172861 A1* | 6/2019 | Hsieh .................... H01L 23/552 |

OTHER PUBLICATIONS

Chinese language office action dated Feb. 23, 2024, issued in application No. CN 202110788089.2.

* cited by examiner

PACKAGE STRUCTURE AND ANTENNA DEVICE USING THE SAME

CROSS REFERENCE TO RELATED APPLICATIONS

This application is a Continuation of pending U.S. patent application Ser. No. 16/246,663, filed Jan. 14, 2019 and entitled "PACKAGE STRUCTURE AND ANTENNA DEVICE USING THE SAME", which claims the benefit of U.S. Provisional Application No. 62/711,671, filed Jul. 30, 2018, and the entirety of which is incorporated by reference herein.

BACKGROUND

Technical Field

Embodiments of the present disclosure relate to a package structure and an antenna device using the same, and in particular they relate to a package structure for communication applications and an antenna device using the same.

Description of the Related Art

Antennas are typically used for enabling wireless communication. In a high frequency application, such as 5th generation wireless systems (5G), satellites and automotive radars, these antennas need to have good, adjustable directivity. Therefore, phase array antennas are commonly used in high frequency applications.

However, traditional package structures for phase array antennas may not meet demands for antenna devices in high frequency applications nowadays because of their high manufacturing cost, high dielectric loss, and larger areas.

SUMMARY

In accordance with some embodiments of the present disclosure, an antenna device is provided. The antenna device includes a first substrate and a second substrate facing the first substrate. The first substrate includes an inner surface and an outer surface opposite the inner surface of the first substrate. The second substrate includes an inner surface and an outer surface opposite the inner surface of the second substrate. The antenna device also includes a die disposed between the first substrate and the second substrate, a redistribution layer disposed between the die and the inner surface of the second substrate, and an antenna unit electrically connected to the die via the redistribution layer. The antenna unit is arranged on at least one of the inner surface of the first substrate, the outer surface of the first substrate, the inner surface of the second substrate, and the outer surface of the second substrate.

In accordance with some other embodiments of the present disclosure, a package structure is provided. The package structure includes a first substrate and a second substrate facing the first substrate, a redistribution layer disposed between the first substrate and the second substrate, a die disposed between the redistribution layer and the first substrate, a metal layer electrically connected to the redistribution layer, and a sealant disposed between the first substrate and the second substrate and surrounding the die.

BRIEF DESCRIPTION OF THE DRAWINGS

Aspects of the embodiments of the present disclosure are understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 45 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

Figure 1:
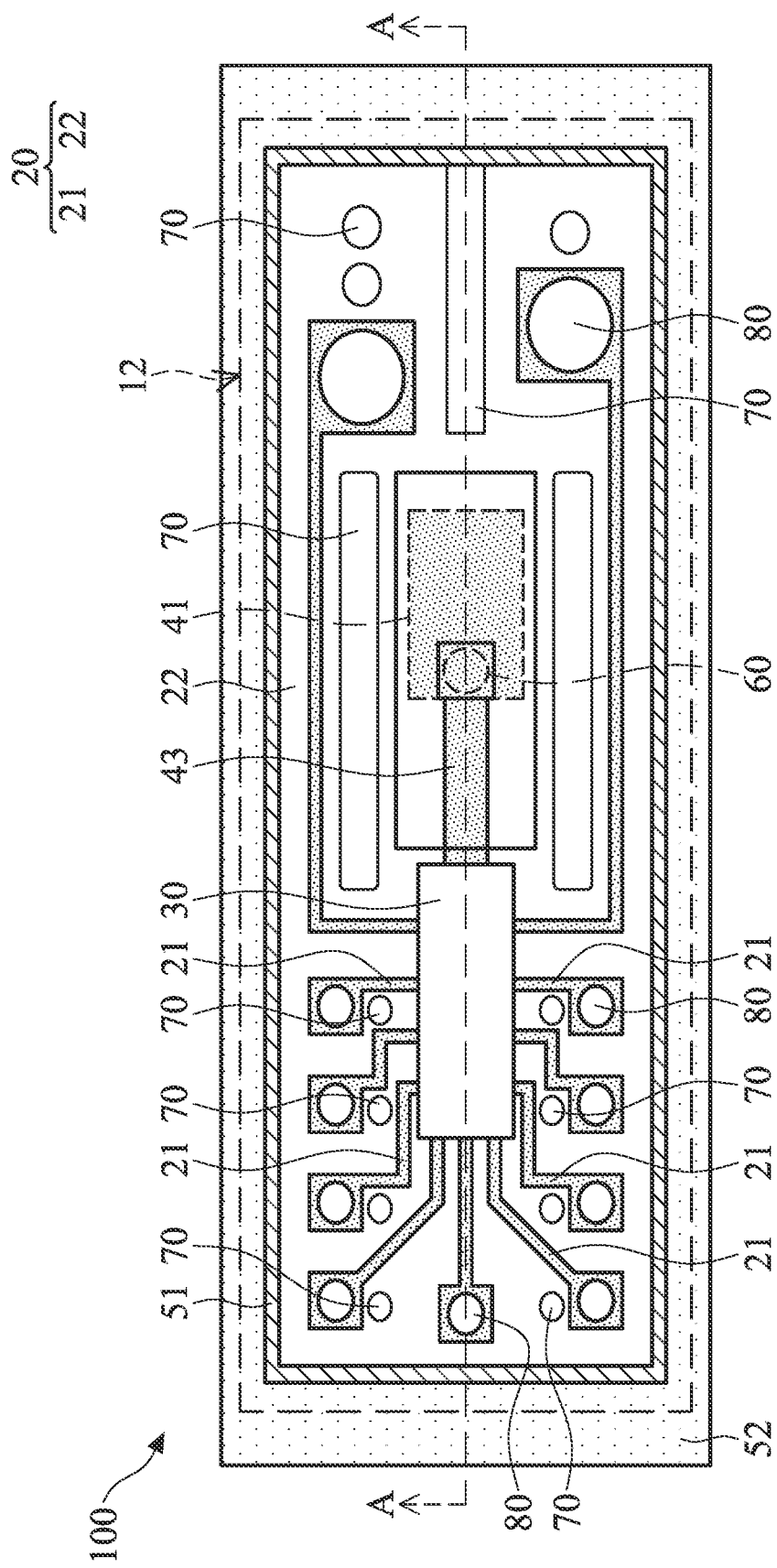
FIG. 1 is a partial top view illustrating a package structure according to one embodiment of the present disclosure.
Figure 2:
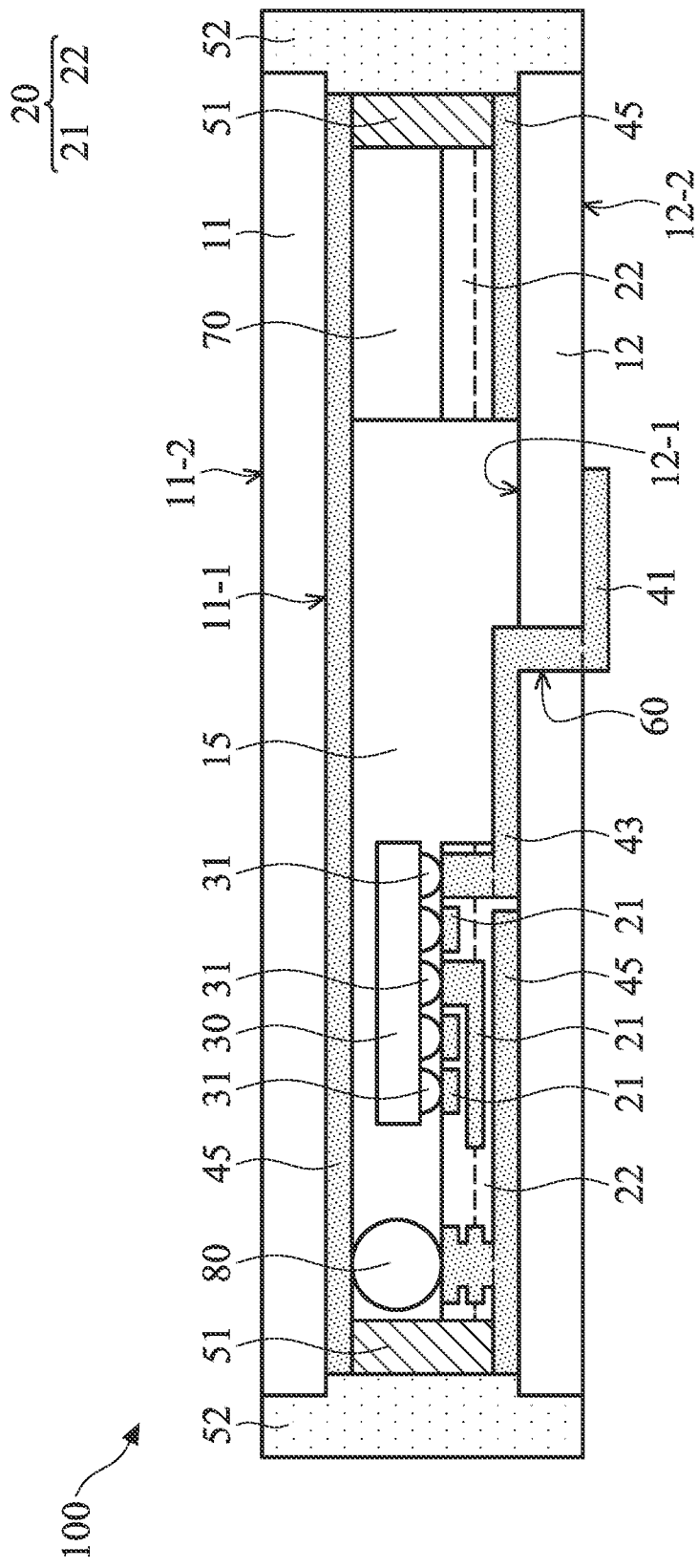
FIG. 2 is a partial cross-sectional view illustrating along line A-A in FIG. 1.

FIG. 1 is a partial top view illustrating a package structure 100 according to one embodiment of the present disclosure, and FIG. 2 is a partial cross-sectional view illustrating along line A-A in FIG. 1. It should be noted that not all components of the package structure 100 are shown in FIGS. 1-2, for the sake of brevity.

Referring to FIGS. 1 and 2, the package structure 100 includes a first substrate 11 which is not shown in FIG. 1, a second substrate 12 facing the first substrate 11, a redistribution layer (RDL) 20 disposed between the first substrate 11 and the second substrate 12, a die 30 disposed on the redistribution layer 20, a metal layer 41 electrically connected to the redistribution layer 20, and a sealant 51 disposed between the first substrate 11 and the second substrate 12 and surrounding the die 30.

As shown in FIG. 2, the first substrate 11 has an inner surface 11-1 and an outer surface 11-2 opposite the inner surface 11-1. The second substrate 12 faces the first substrate 11, and similarly has an inner surface 12-1 and an outer surface 12-2 opposite the inner surface 12-1. Here, the first substrate 11 and the second substrate 12 may be exclusive of elemental semiconductor substrates (e.g., silicon, germanium), compound semiconductor substrates (e.g., tantalum carbide, gallium arsenide, indium arsenide or indium phosphide), alloy semiconductor substrates (e.g., silicon germanium, silicon germanium carbide, gallium arsenic phosphide or gallium indium phosphide), and so on.

In this embodiment, a material of one of the first substrate 11 and the second substrate 12 comprises at least one of glass, polyimide (PI), liquid-crystal polymer (LCP), polycarbonate (PC), polypropylene (PP), polyethylene terephthalate (PET) and other plastic or polymer materials. But the present disclosure is not limited thereto.

The redistribution layer 20 and the die 30 are both disposed between the first substrate 11 and the second substrate 12. As shown in FIGS. 1 and 2, the redistribution layer 20 is disposed between the die 30 and the inner surface 12-1 of the second substrate 12. In other words, the die 30 is disposed between the redistribution layer 20 and the first substrate 11. The die 30 may be a bare die, and the redistribution layer 20 may include a plurality of wire 21 and a plurality of insulating layers 22 that make the I/O pads 31 of integrated circuit of the die 30 available in other locations. It should be noted that some components of the redistribution layer 20 in FIGS. 1 and 2 have been omitted here, for the sake of brevity. That is, the structure of the redistribution layer 20 should not be limited to the structure as shown in FIGS. 1 and 2.

In this embodiment, the metal layer 41 may be an antenna unit, so that the package structure 100 may be an antenna device. The metal layer (or the antenna unit) 41 may be electrically connected to the die 30 via the redistribution layer 20. The die 30 may receive and/or transmit an electronic-magnetic wave through the metal layer (or the antenna unit) 41. As shown in FIG. 2, the metal layer (or the antenna unit) 41 is arranged on the outer surface 12-2 of the second substrate 12, but the present disclosure is not limited thereto. In some embodiments, the metal layer (or the antenna unit) 41 may be arranged on the outer surface 11-2 of the first substrate 11, the inner surface 11-1 of the first substrate 11, or the inner surface 12-1 of the second substrate 12.

In this embodiment, the sealant 51 is disposed between the first substrate 11 and the second substrate 12, and the sealant 51 surrounds the die 30. The sealant 51 is used to keep the package structure 100 sealed. In some embodiments, the sealant 51 may be a conductive sealant.

In this embodiment, the remaining space 15 between the first substrate 11 and the second substrate 12 inside the sealant 51 is vacant. In some embodiments, the remaining space 15 between the first substrate 11 and the second substrate 12 inside the sealant 51 may be filled with air, inert gases or low loss-tangent materials (such as fluoropolymer). Compared to traditional package structures using molding compounds, since the remaining space 15 between the first substrate 11 and the second substrate 12 inside the sealant 51 is vacant or filled with air or inert gases, the effects due to the different coefficients of thermal expansion (CTE) between different components may be low. Therefore, the reliability of the package structure (or the antenna device) 100 may be effectively enhanced.

Referring to FIGS. 1 and 2, in this embodiment, the package structure 100 further includes a wire 43 disposed between the first substrate 11 and the second substrate 12. In more detail, the wire 43 may be a transmission line which is electrically connected to the die 30 through the redistribution layer 20 and electrically connected to the metal layer 41. In the embodiment as shown in FIG. 2, at least one via hole 60 penetrates the second substrate 12, and the wire (transmission line) 43 passes through the via hole 60 to connect to the metal layer 41. However, the present disclosure is not limited thereto. In other embodiments, if the metal layer 41 is disposed on the outer surface 11-2 of the first substrate 11 (as shown in following FIG. 4), then the via hole 60 may penetrate the first substrate 11, and the wire (transmission line) 43 passes through the via hole 60 to connect to the metal layer 41.

In other words, the second substrate 12 (or the first substrate 11) may include at least one via hole 60, and the wire 43 may pass through the via hole 60 and electrically connect the metal layer (or the antenna unit) 41 to the redistribution layer 20 and the die 30.

Since the wire 43 passes through the second substrate 12 (or the first substrate 11), the remaining space 15 (which is vacant or filled with air, inert gases or low loss-tangent materials), and the redistribution layer 20 to electrically connect the metal layer (or the antenna unit) 41 and the die 30, dielectric loss may be lower than in traditional structures (e.g., the antenna, antennas or phase array antenna made through printed circuit board (PCB)).

Moreover, the die 30 is sealed between the first substrate 11 and the second substrate 12 inside the sealant 51, so that the package structure 100 may have better corrosion resistance than traditional packages.

Furthermore, the manufacturing cost of the antenna device using the package structure 100 according to the embodiments of the present disclosure may be lower than the manufacturing cost of the traditional AiP (Antenna in Package).

It should be noted that the number and the location of the sealant 51 and the number and the location of the spacers 70 may be different from FIGS. 1 and 2, depending on demand.

In some embodiments, the package structure 100 may further include at least one shielding layer 45 disposed on at least one of the inner surface 11-1 of the first substrate 11 and the inner surface 12-1 of the second substrate 12. For example, the shielding layers 45 are disposed on both the inner surface 11-1 of the first substrate 11 and the inner surface 12-1 of the second substrate 12 as shown in FIG. 2. The shielding layer 45 may be another metal layer (e.g., a ground layer) for electromagnetic shielding that blocks radio frequency electromagnetic radiation.

In some embodiments, the package structure 100 may further include at least one bonding element 80 disposed between first substrate 11 and the second substrate 12. For example, the package structure 100 includes solder balls disposed on the redistribution layer 20. These solder balls are used as bonding elements 80 to electrically connect the conductive component (e.g., the shielding layer 45) on the inner surface 11-1 of the first substrate 11 to the conductive component (e.g., the shielding layer 45) on the inner surface 12-1 of the second substrate 12.

It should be noted that the bonding element 80 is not limited to the form of solder balls as shown in FIGS. 1 and 2. Other suitable forms may be applied in the package structure 100. Similarly, the number and the location of the bonding element 80 may be different from FIGS. 1 and 2, depending on demand.

In some embodiments, the package structure 100 may further include a potting compound layer 52 disposed outside the sealant 51. In more detail, the potting compound layer 52 may be a second sealant, and the sealant 51 is disposed between the potting compound layer 52 and the die 30. The potting compound layer 52 may provide better protection for the die 30 between the first substrate 11 and the second substrate 12.

Figure 3:
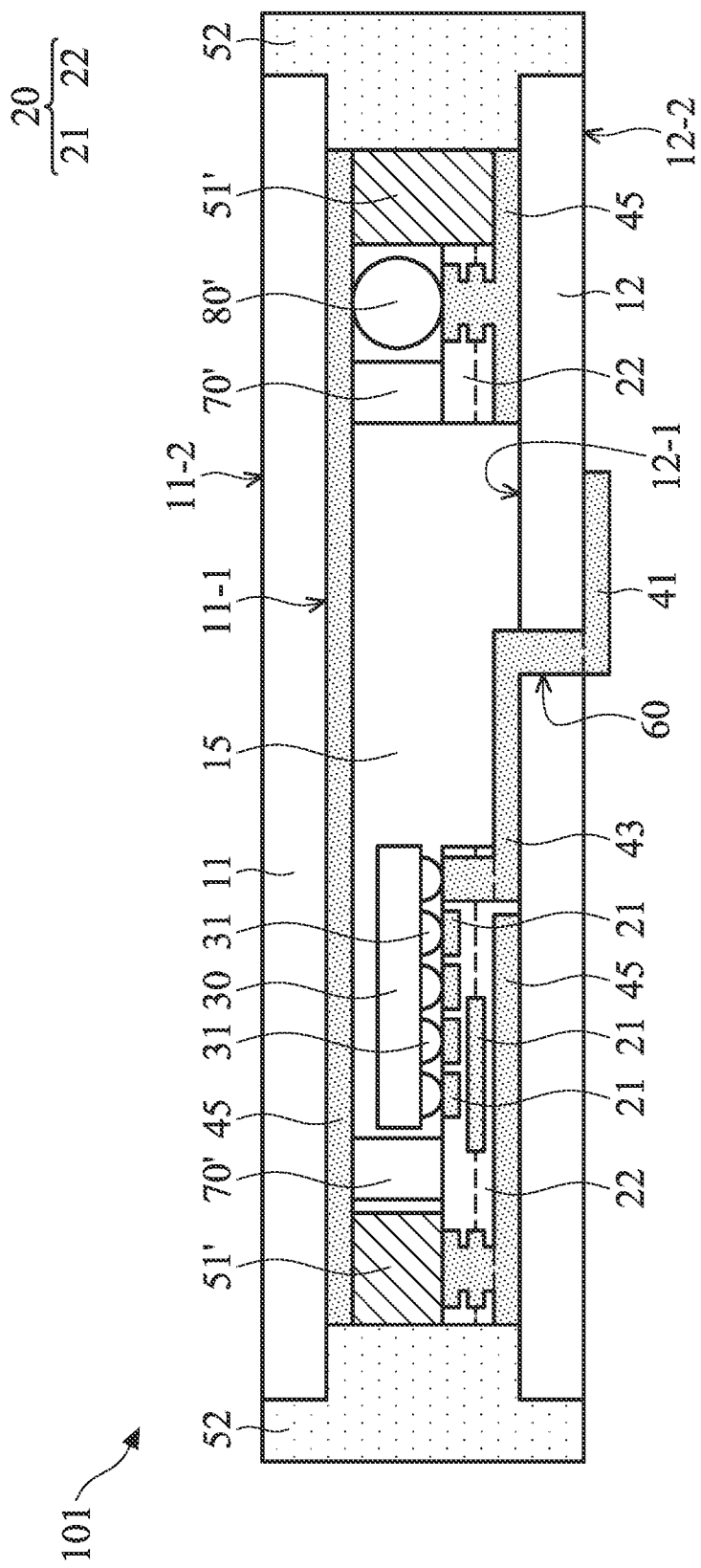
FIG. 3 is a partial cross-sectional view illustrating a package structure according to another embodiment of the present disclosure.

FIG. 3 is a partial cross-sectional view illustrating a package structure 101 according to another embodiment of the present disclosure. In this embodiment, the package structure 101 is used as an antenna device. The package structure (or the antenna device) 101 includes a first substrate 11 and a second substrate 12 facing the first substrate 11. The package structure (or the antenna device) 101 also includes a die 30 disposed between the first substrate 11 and the second substrate 12, a redistribution layer (RDL) 20 disposed between the die 30 and the second substrate 12, and a metal layer (or the antenna unit) 41 electrically connected to the die via the redistribution layer 20.

As shown in FIG. 3, the first substrate 11 has an inner surface 11-1 and an outer surface 11-2 opposite the inner surface 11-1, and the second substrate 12 has an inner surface 12-1 and an outer surface 12-2 opposite the inner surface 12-1. In this embodiment, the metal layer (or the antenna unit) 41 is arranged on the outer surface 12-2 of the second substrate 12.

In this embodiment, the first substrate 11 and the second substrate 12 may be glass substrates. However, the present disclosure is not limited thereto. In other embodiments, the first substrate 11 and the second substrate 12 may be polyimide (PI) substrates, liquid-crystal polymer (LCP) substrates, polycarbonate (PC) substrates, polypropylene (PP) substrates, polyethylene terephthalate (PET) substrates or other plastic or polymer substrates.

As shown in FIG. 3, the redistribution layer 20 and the die 30 are both disposed between the first substrate 11 and the second substrate 12, and some portions of the redistribution layer 20 is disposed between the die 30 and the inner surface 12-1 of the second substrate 12. In other words, the die 30 is disposed between the redistribution layer 20 and the first substrate 11. The die 30 may be a bare die, and the redistribution layer 20 may include a plurality of wire 21 and a plurality of insulating layers 22 that make the I/O pads 31 of integrated circuit of the die 30 available in other locations. Similarly, some components of the redistribution layer 20 in FIG. 3 have been omitted here, for the sake of brevity. That is, the structure of the redistribution layer 20 should not be limited to the structure as shown in FIG. 3.

The metal layer (or the antenna unit) 41 may be electrically connected to the die 30 via the redistribution layer 20. The die 30 may receive and/or transmit an electronicmagnetic wave through the metal layer (or the antenna unit) 41. As shown in FIG. 3, the metal layer (or the antenna unit) 41 is arranged on the outer surface 12-2 of the second substrate 12, but the present disclosure is not limited thereto.

Moreover, the package structure (or the antenna device) 101 may include a sealant 51' disposed between the first substrate 11 and the second substrate 12, and the sealant 51' surrounds the die 30. The difference between the package structure 101 and the package structure 100 is that a portion of the sealant 51' (the sealant 51' on the left side in FIG. 3) in the package structure (or the antenna device) 101 is disposed on the redistribution layer 20 as shown in FIG. 3, while the sealant 51 in the package structure (or the antenna device) 100 is disposed outside the redistribution layer 20 as shown in FIG. 2.

In this embodiment, the remaining space 15 between the first substrate 11 and the second substrate 12 inside the sealant 51' is vacant. In some embodiments, the remaining space 15 between the first substrate 11 and the second substrate 12 inside the sealant 51' may be filled with air, inert gases or low loss-tangent materials (such as fluoropolymer). Compared to traditional package structures using molding compounds, since the remaining space 15 between the first substrate 11 and the second substrate 12 inside the sealant 51' is vacant or filled with air or inert gases, the effects due to the different coefficients of thermal expansion (CTE) between different components may be low. Therefore, the reliability of the package structure (or the antenna device) 101 may be effectively enhanced.

Referring to FIG. 3, in this embodiment, the package structure 101 further includes a wire 43 disposed between the first substrate 11 and the second substrate 12. In more detail, the wire 43 may be a transmission line which is electrically connected to the die 30 through the redistribution layer 20 and electrically connected to the metal layer 41. In the embodiment as shown in FIG. 3, at least one via hole 60 penetrates the second substrate 12, and the wire (transmission line) 43 passes through the via hole 60 to connect to the metal layer 41. However, the present disclosure is not limited thereto.

In other words, the second substrate 12 may include at least one via hole 60, and the wire 43 may pass through the via hole 60 and electrically connect the metal layer (or the antenna unit) 41 to the redistribution layer 20 and the die 30.

Since the wire 43 passes through the second substrate 12, the remaining space 15 (which is vacant or filled with air, inert gases or low loss-tangent materials), and the redistribution layer 20 to electrically connect the metal layer (or the antenna unit) 41 and the die 30, dielectric loss may be lower than in traditional structures (e.g., the antenna made through printed circuit board (PCB)).

Moreover, the die 30 is sealed between the first substrate 11 and the second substrate 12 inside the sealant 51', so that the package structure 101 may have better corrosion resistance than traditional packages.

Furthermore, the manufacturing cost of the antenna device using the package structure 101 according to the embodiments of the present disclosure may be lower than the manufacturing cost of the traditional AiP (Antenna in Package).

In this embodiment, the package structure 101 may further include a plurality of spacers 70' disposed between the first substrate 11 and the second substrate 12 as shown in FIG. 3. The spacers 70' may be used to maintain the gap between the first substrate 11 and the second substrate 12. For example, the spacers 70' may be cell gap spacers, such as a ball spacer, a photo spacer, glass fiber, or another suitable spacer.

In this embodiment, the package structure 101 may further include shielding layers 45 disposed on both the inner surface 11-1 of the first substrate 11 and the inner surface 12-1 of the second substrate 12 as shown in FIG. 3. Each of the shielding layers 45 may be another metal layer (e.g., a ground layer) for electromagnetic shielding that blocks radio frequency electromagnetic radiation.

In this embodiment, the package structure 101 may further include at least one bonding element 80' disposed between first substrate 11 and the second substrate 12. For example, the package structure 101 includes solder balls disposed on the redistribution layer 20. These solder balls are used as bonding elements 80' to electrically connect the conductive component (e.g., the shielding layer 45) on the inner surface 11-1 of the first substrate 11 to the conductive component (e.g., the shielding layer 45) on the inner surface 12-1 of the second substrate 12.

Moreover, the number and the location of the spacers 70' and the number and the location of the bonding element 80' in the package structure 101 as shown in FIG. 3 are different from the number and the location of the spacers 70 and the number and the location of the bonding element 80 in the package structure 100 as shown in FIG. 2.

Similarly, the package structure 101 may further include a potting compound layer 52 disposed outside the sealant 51'. In more detail, the potting compound layer 52 may be a second sealant, and the sealant 51' is disposed between the potting compound layer 52 and the die 30. The potting compound layer 52 may provide better protection for the die 30 between the first substrate 11 and the second substrate 12.

Figure 4:
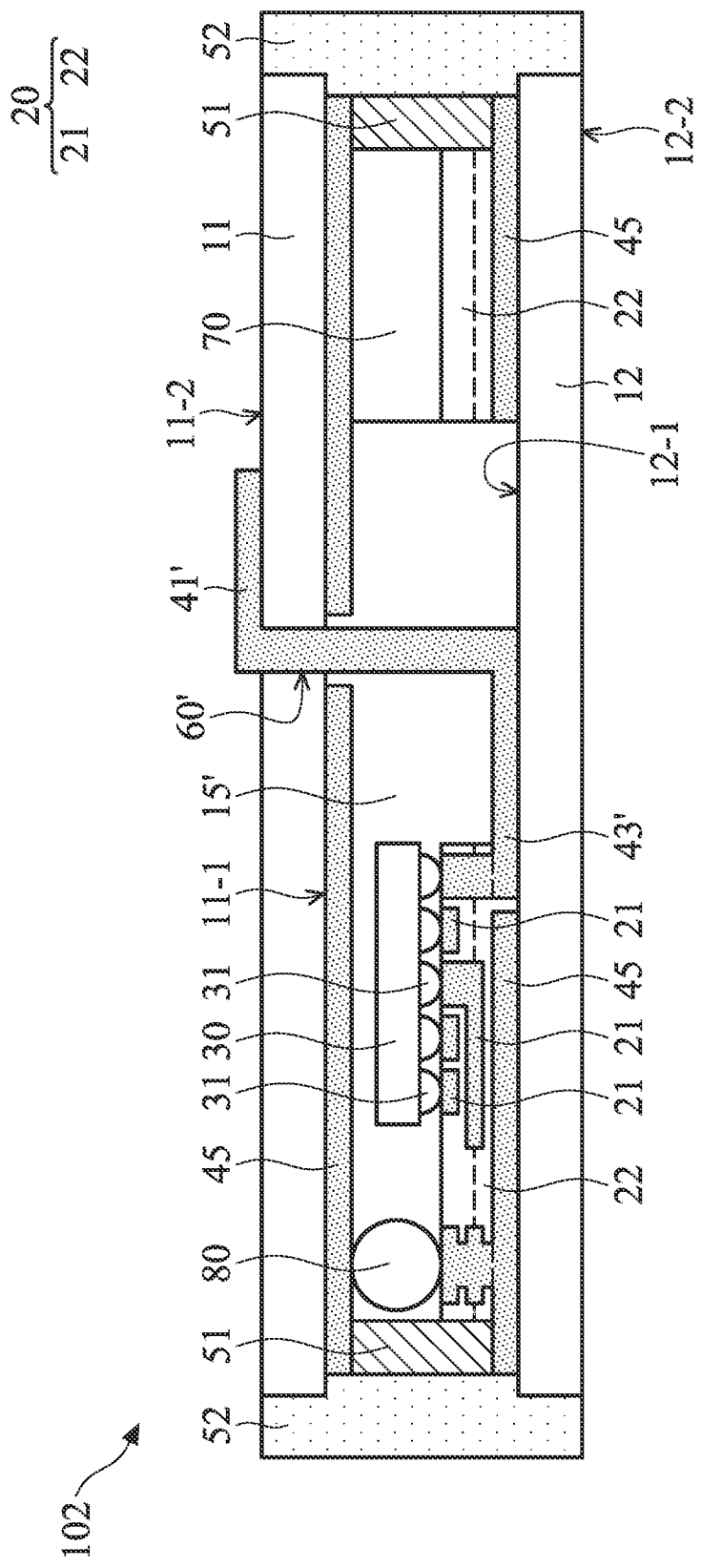
FIG. 4 is a partial cross-sectional view illustrating a package structure according to still another embodiment of the present disclosure.

FIG. 4 is a partial cross-sectional view illustrating a package structure 102 according to still another embodiment of the present disclosure. Referring to FIG. 4, the package structure 102 includes a first substrate 11 and a second substrate 12 opposite each other, a redistribution layer (RDL) 20 disposed between the first substrate 11 and the second substrate 12, a die 30 disposed on the redistribution layer 20, a metal layer 41' electrically connected to the redistribution layer 20, and a sealant 51 disposed between the first substrate 11 and the second substrate 12 and surrounding the die 30.

As shown in FIG. 4, the first substrate 11 has an inner surface 11-1 and an outer surface 11-2 opposite the inner surface 11-1. The second substrate 12 faces the first substrate 11, and similarly has an inner surface 12-1 and an outer surface 12-2 opposite the inner surface 12-1.

In this embodiment, the first substrate 11 and the second substrate 12 may be glass substrates. However, the present disclosure is not limited thereto. In other embodiments, the first substrate 11 and the second substrate 12 may be polyimide (PI) substrates, liquid-crystal polymer (LCP) substrates, polycarbonate (PC) substrates, polypropylene (PP) substrates, polyethylene terephthalate (PET) substrates or other plastic or polymer substrates.

The redistribution layer 20 and the die 30 are both disposed between the first substrate 11 and the second substrate 12. As shown in FIG. 4, the redistribution layer 20 is disposed between the die 30 and the inner surface 12-1 of the second substrate 12. In other words, the die 30 is disposed between the redistribution layer 20 and the first substrate 11. The die 30 may be a bare die, and the redistribution layer 20 may include a plurality of wire 21 and a plurality of insulating layers 22 that make the I/O pads 31 of integrated circuit of the die 30 available in other locations. It should be noted that some components of the redistribution layer 20 in FIG. 4 have been omitted here, for the sake of brevity. That is, the structure of the redistribution layer 20 should not be limited to the structure as shown in FIG. 4.

In this embodiment, the metal layer 41' may be an antenna unit, so that the package structure 102 may be an antenna device. The metal layer (or the antenna unit) 41' may be electrically connected to the die 30 via the redistribution layer 20. The die 30 may receive and/or transmit an electronic-magnetic wave through the metal layer (or the antenna unit) 41'. The difference between the package structure 102 and the package structure 100 is that the metal layer 41' in the package structure 102 is disposed on the outer surface 11-2 of the first substrate 11 as shown in FIG. 4, while the metal layer 41 in the package structure 100 is disposed on the outer surface 12-2 of the second substrate 12 as shown in FIG. 2.

In this embodiment, the sealant 51 is disposed between the first substrate 11 and the second substrate 12, and the sealant 51 surrounds the die 30. The sealant 51 is used to keep the package structure 100 sealed. In some embodiments, the sealant 51 may be a conductive sealant.

In this embodiment, the remaining space 15' between the first substrate 11 and the second substrate 12 inside the sealant 51 is filled with low loss-tangent materials (such as fluoropolymer).

Referring to FIG. 4, in this embodiment, the package structure 102 further includes a wire 43' disposed between the first substrate 11 and the second substrate 12. In more detail, the wire 43' may be a transmission line which is electrically connected to the die 30 through the redistribution layer 20 and electrically connected to the metal layer 41'. In the embodiment as shown in FIG. 4, at least one via hole 60' penetrates the first substrate 11, and the wire (transmission line) 43' passes through the via hole 60' to connect to the metal layer 41'.

In other words, the first substrate 11 may include at least one via hole 60', and the wire 43' may pass through the via hole 60' and electrically connect the metal layer (or the antenna unit) 41' to the redistribution layer 20 and the die 30.

Since the wire 43' passes through the first substrate 11, the remaining space 15' (which is filled with low loss-tangent materials), and the redistribution layer 20 to electrically connect the metal layer (or the antenna unit) 41' and the die 30, dielectric loss may be lower than in traditional structures (e.g., the antenna made through printed circuit board (PCB)).

Moreover, the die 30 is sealed between the first substrate 11 and the second substrate 12 inside the sealant 51, so that the package structure 102 may have better corrosion resistance than traditional packages.

Furthermore, the manufacturing cost of the antenna device using the package structure 102 according to the embodiments of the present disclosure may be lower than the manufacturing cost of the traditional AiP (Antenna in Package).

In some embodiments, the package structure 102 may further include a plurality of spacers 70 disposed between the first substrate 11 and the second substrate 12. The spacers 70 may be used to maintain the gap between the first substrate 11 and the second substrate 12. For example, the spacers 70 may be cell gap spacers, such as a ball spacer, a photo spacer, glass fiber, or another suitable spacer.

In some embodiments, the package structure 102 may further include shielding layers 45 disposed on both the inner surface 11-1 of the first substrate 11 and the inner surface 12-1 of the second substrate 12 as shown in FIG. 4. Each of the shielding layers 45 may be another metal layer (e.g., a ground layer) for electromagnetic shielding that blocks radio frequency electromagnetic radiation.

In some embodiments, the package structure 102 may further include at least one bonding element 80 disposed between first substrate 11 and the second substrate 12. For example, the package structure 102 includes solder balls disposed on the redistribution layer 20. These solder balls are used as bonding elements 80 to electrically connect the conductive component (e.g., the shielding layer 45) on the inner surface 11-1 of the first substrate 11 to the conductive component (e.g., the shielding layer 45) on the inner surface 12-1 of the second substrate 12.

In some embodiments, the package structure 102 may further include a potting compound layer 52 disposed outside the sealant 51. In more detail, the potting compound layer 52 may be a second sealant, and the sealant 51 is disposed between the potting compound layer 52 and the die 30. The potting compound layer 52 may provide better protection for the die 30 between the first substrate 11 and the second substrate 12.

It should be noted that the antenna device is used as an example in the embodiments described above, but the present disclosure is not limited thereto. In some embodiments, the package structure 100 (or 101, 102) may be used in other devices for communication application.

In summary, the package structure (or the antenna device) of the embodiments of the present disclosure includes the first substrate and the second substrate, and the remaining space between the first substrate and the second substrate inside the sealant is vacant or filled with air or inert gases, and thus the effects due to the different coefficients of thermal expansion (CTE) between different components may be low. Furthermore, in the package structure (or the antenna device) of the embodiments of the present disclosure, the wire (transmission line) passes through one of the first substrate and the second substrate, the remaining space (which is vacant or filled with air, inert gases or low loss-tangent materials), and the redistribution layer to electrically connect the metal layer (or the antenna unit) and the die, and thus the dielectric loss may be effectively reduced. Furthermore, the die in the package structure (or the antenna device) of the embodiments of the present disclosure is sealed between the first substrate and the second substrate inside the sealant (and the sealant may be inside the potting compound layer in some embodiments), and thus the package structure (or the antenna device) may have better corrosion resistance and the reliability of the package structure (or the antenna device) may be effectively enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined by the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An antenna device, comprising:
   a first substrate, wherein the first substrate comprises an inner surface and an outer surface opposite the inner surface of the first substrate;
   a second substrate facing the first substrate, wherein the second substrate comprises an inner surface and an outer surface opposite the inner surface of the second substrate;
   a first sealant and a plurality of spacers disposed between the first substrate and the second substrate;
   a remaining space between the first substrate and the second substrate and inside the first sealant;
   a die disposed between the first substrate and the second substrate, wherein a part of the remaining space is disposed between the die and the first substrate;
   a redistribution layer disposed between the die and the inner surface of the second substrate;
   an antenna unit electrically connected to the die via the redistribution layer; and
   shielding layers disposed on an inner surface of the first substrate and an inner surface of the second substrate,
   wherein the remaining space is vacant or filled with air or inert gases and the antenna unit is arranged on at least one of the inner surface of the first substrate, the outer surface of the first substrate, the inner surface of the second substrate, and the outer surface of the second substrate.

2. The antenna device of claim 1, further comprising:
   a second sealant,
   wherein the first sealant is disposed between the second sealant and the die.

3. The antenna device of claim 1, further comprising:
   a wire;
   wherein the second substrate comprises at least one via hole, and the wire passes through the via hole and is electrically connected the antenna unit and the redistribution layer.

4. The antenna device of claim 1, further comprising:
   a wire;
   wherein the first substrate comprises at least one via hole, and the wire passes through the via hole and is electrically connected the antenna unit and the redistribution layer.

5. The antenna device of claim 1, wherein a material of one of the first substrate and the second substrate comprises at least one of glass, polyimide, liquid-crystal polymer, polycarbonate, polypropylene, and polyethylene terephthalate.

6. A package structure, comprising:
   a first substrate;
   a second substrate facing the first substrate;
   a first sealant and a plurality of spacers disposed between the first substrate and the second substrate;
   a remaining space between the first substrate and the second substrate and inside the first sealant;
   a redistribution layer disposed in the remaining space;
   a die disposed between the redistribution layer and the first substrate, wherein a part of the remaining space is disposed between the die and the first substrate;

a metal layer electrically connected to the redistribution layer; and shielding layers disposed on an inner surface of the first substrate and an inner surface of the second substrate, wherein the remaining space is vacant or filled with air or inert gases.

7. The package structure of claim 6, further comprising:
a transmission line disposed between the first substrate and the second substrate;
wherein the transmission line is electrically connected to the die through the redistribution layer, and the transmission line is electrically connected to the metal layer.

8. The package structure of claim 7, further comprising:
at least one via hole penetrating one of the first substrate and the second substrate;
wherein the transmission line passes through the at least one via hole to connect to the metal layer.

9. The package structure of claim 6, further comprising:
at least one bonding element disposed between the first substrate and the second substrate.

10. The package structure of claim 6, wherein the metal layer is disposed on an inner surface of one of the first substrate and the second substrate or on an outer surface of one of the first substrate and the second substrate.

11. The package structure of claim 6, wherein the metal layer is an antenna unit.

12. The package structure of claim 6, wherein a material of one of the first substrate and the second substrate comprises at least one of glass, polyimide, liquid-crystal polymer, polycarbonate, polypropylene, and polyethylene terephthalate.

13. The package structure of claim 6, further comprising:
a potting compound layer disposed outside the sealant.

* * * * *